United States Patent [19]

Vig

[11] 4,255,228

[45] Mar. 10, 1981

[54] METHOD OF GROWING QUARTZ

[75] Inventor: John R. Vig, Colts Neck, N.J.

[73] Assignee: The United States of America as represented by the Secretary of the Army, Washington, D.C.

[21] Appl. No.: 1,238

[22] Filed: Jan. 5, 1979

[51] Int. Cl.$^3$ .......................... C30B 7/10; C30B 29/18
[52] U.S. Cl. ..................... 156/623 Q; 156/DIG. 111; 310/361
[58] Field of Search ................... 29/25.35; 156/623 Q, 156/DIG. 111, 628; 310/361

[56] References Cited

U.S. PATENT DOCUMENTS

| | | | |
|---|---|---|---|
| 1,958,014 | 5/1934 | Nicolson | 29/25.35 |
| 2,387,142 | 10/1945 | Frutk | 29/25.35 |
| 2,411,298 | 11/1946 | Shore | 29/25.35 |
| 2,785,058 | 3/1957 | Buehler | 156/623 Q |
| 3,932,777 | 1/1976 | King | 156/623 Q |

OTHER PUBLICATIONS

Brice, "The Growth of Crystals from Liquid", North Holland Press, Mar. 1973, pp. 33, 34, 192-194, 240 and 289.
Plumley, Arthur L.; A Simplified Bomb for Hydrothermal Synthesis; from Journal of Chemistry Education; vol. 37, #4, Apr. 1960, p. 201.
Demianets, L. N.; Hydrothermal Crystallization; from Crystals vol. 1, Mar. 1978, pp. 116, 117, 120, 121.
Kolb et al., Phase Equilibria, from Journal of Crystal Growth, vol. 29, May 1975, pp. 29-39.
Kolb et al., Hydrothermal Growth, from Journal of Applied Physics, vol. 42, #4, Mar. 1971, pp. 1552-1554.

*Primary Examiner*—Frank W. Lutter
*Assistant Examiner*—Gregory N. Clements
*Attorney, Agent, or Firm*—Nathan Edelberg; Jeremiah G. Murray; Roy E. Gordon

[57] ABSTRACT

Quartz is grown from a quartz seed material by depositing electrodes onto the seed, heating the seed to about 500 degrees C. while applying an electric field along the Z-axis of the seed of a strength of about 2 kV/cm for about 72 hours, maintaining the electric field while the seed is cooled to room temperature, removing the electrodes from the cathode surface of the seed, etching the seed, placing the seed in an autoclave and hydrothermally growing quartz.

20 Claims, No Drawings

METHOD OF GROWING QUARTZ

The invention described herein may be manufactured, used, and licensed by or for the Government for governmental purposes without the payment to me of any royalty thereon.

This invention relates in general to a method of growing quartz and in particular, to a method of improving the quality of quartz grown from a quartz seed by "sweeping" the seed prior to growth of the quartz.

BACKGROUND OF THE INVENTION

Swept quartz generally refers to quartz treated by a method such as described in U.S. Pat. No. 3,932,777 issued to J. C. King on Jan. 13, 1976. This method comprises subjecting a quartz crystal to an electric field at an elevated temperature.

Sweeping, as practiced today, is carried out subsequent to the growth of cultured (or synthetic) quartz. It is performed for the purpose of rendering quartz resonators immune to radiation.

Heretofore, there has been no hint or suggestion in the art of applying the sweeping method to seeds prior to the growth of the quartz in order to improve the quality of cultured quartz.

SUMMARY OF THE INVENTION

The general object of this invention is to provide a method of growing superior quality quartz from a quartz seed. A further object of the invention is to provide such a method in which the seed from which the quartz is grown is first treated to minimize defects in the seed.

The aforementioned objects have now been attained by sweeping the seed prior to growth of the quartz. More particularly, according to the invention, electrodes are placed in contact with the quartz seed so that the anode contacts one face of the seed and the cathode contacts an opposite face of the seed. The quartz seed is then heated to between about 350 degrees C. and about 570 degrees C. while applying an electric field whose component along the Z axis of the seed has a strength of about 0.5 to 6 kV/cm, and maintaining that field at least until the current passing through the quartz has decreased to a substantially constant value as a function of time. The electric field can be maintained while the seed is cooled to room temperature in order to prevent rediffusion of impurities away from the cathode. The electrodes are then removed from the seed; the cathode surface of the seed is lapped to remove the impurities which had migrated to the cathode, and the seed then is deep etched in a fluoride type etchant, such as aqueous solutions of ammonium bifluoride, or hydrogen fluoride, or a mixture of ammonium fluoride and hydrogen fluoride, until all evidence of surface damage produced by the previous etching and lapping of the seed have been removed. The quartz seed is then cleaned; placed in a clean autoclave, and the quartz grown hydrothermally using art established techniques, as, for example, summarized by R. A. Laudise and A. A. Ballman in the Encyclopedia of Chemical Technology, Vol. 18, pp. 105–111, 1969.

The degree of perfection of the grown quartz can be further improved by: 1. selecting a seed having a low dislocation density as the seed to be swept; 2. sweeping the seed by "multiple electrolysis"; as for example, described in U.S. Pat. No. 3,932,777; 3. using noble metal lined autoclaves; 4. using low growth rates, particularly at the start of the growth; 5. selecting the etching solution for deep etching the seed to be one which is a chemical polish for the major faces of the seed; and 6. using high purity quartz nutrient. The purity of the nutrient can be improved by treating the nutrient material in the same manner as the seeds, that is, by sweeping, and then deep etching in a fluoride type solution. In order to assure that chemically polished surfaces on the seed are preserved in the autoclave, the autoclave can be heated up to the growth temperature in such a manner that the dissolution of the seed in the mineralizer is minimized during the warm-up.

A less time consuming method of improving both the seeds and the nutrient material is to omit the sweeping and just deep etch in a fluoride type solution as, for example, by removing by etching a minimum of 4 percent from the Z dimensions of the quartz pieces. The deep etching has been found to be able to improve quartz by removing from the quartz those impurities which had segregated at dislocations. Since extremely high purity fused quartz is commercially available, the use of such fused quartz as the nutrient is another alternative. The art established growth techniques would then need to be correspondingly modified to compensate for the different properties of this nutrient, as, for example, by adjusting the temperatures and the pressure in the autoclave until the fused quartz nutrient is dissolving at about the same rate as crystalline quartz normally does during growth.

DESCRIPTION OF THE PREFERRED EMBODIMENT

A slab of seed material is cut from a larger bar of quartz and is used as the seed material for the growth of the crystal. The seed is approximately 2 cm along the X-axis, 1 cm along the Z-axis and 16 cm along the X-axis. The seed is strain free as observed under a polariscope, is also free of twinning, inclusions or other obvious defects, and has low dislocation density as revealed by X-ray topography.

Platinum electrodes are deposited onto the Z-faces of the seed by vacuum evaporation. Platinum foil electrodes are then pressed onto the evaporated electrodes. The quartz seed is then heated to about 500 degrees C. while applying an electric field along the Z axis of the seed of a strength of about 2 kV/cm for about 72 hours. The electric field is maintained while the seed is cooled to room temperature. The electrodes are then removed from the seed by lapping first with a coarse abrasive, and then with a 3 $\mu$m aluminum oxide abrasive until a minimum of 0.2 mm is removed from the cathode surface of the seed. The seed is then etched in an aqueous solution of ammonium fluoride and hydrogen fluoride until a minimum of 25 $\mu$m is removed from the Z-faces. The nutrient material is similarly etched, except that the depth of etching is increased to remove a minimum of 0.5 mm from the Z-directions. The seed and nutrient materials are then placed into a silver lined autoclave in which the internal parts, such as the baffle and seed holder frames, are also made of silver or are silver plated. Quartz is then grown in the autoclave by art established techniques.

It is found that the use of swept seed results in a better quality cultured quartz than the use of unswept seed. That is, there are fewer defects in the quartz grown from the swept seed. Moreover, sweeping the seed material is faster than sweeping the grown quartz bar.

The method is believed to work because defects in the seed, both bulk and surface defects, can propagate into the grown material. Sweeping and deep etching can greatly reduce defects such as lattice strains in the seed, and thereby can greatly reduce the defects in the grown quartz.

In the method of the invention, the size or crystallographic orientation of the seed material used is not critical. The electrodes deposited on the quartz for sweeping should be of a material that does not diffuse substantially into the quartz. Suitable electrode materials include gold, platinum, and other metals from the platinum series, that is, rhodium, palladium, osmium, iridium, and ruthenium. Platinum is preferred. The electrodes may be deposited on the seed material by conventional deposition techniques as for example sputtering, vacuum evaporation, etc., or may be just pressed on foils.

Sweeping can be carried out in air, or in an atmosphere that is substantially free of hydrogen, such as in vacuum, nitrogen, or inert gas. After sweeping, the deposited electrodes can be removed by chemical means, as for example, dissolution in aqua regia. The electrodes can also be removed by mechanical means such as lapping with an abrasive. It is also desirable to remove, as, for example, by additional lapping, the impurities which have diffused to the cathode surface of the seed. Then, the seed may be etched in a fluoride type solution until all evidence of damage produced by the lapping is removed. The seed is then placed in an autoclave and the quartz is grown hydrothermally according to art established techniques. As an alternative to etching in a fluoride type solution, the lapping damage may be removed by dissolving part of the seed in the autoclave using the hot mineralizer as the etchant.

I wish it to be understood that I do not desire to be limited to the exact details described, for obvious modifications will occur to a person skilled in the art. The method, for example, need not be limited to quartz, for it is also applicable to other materials which can be grown from a seed, as, for example, berlinite.

What is claimed is:

1. Method of growing quartz from a quartz seed, said method including the steps of
   (a) heating the quartz seed to between about 350 degrees C. and about 570 degrees C. while applying an electric field whose component, along the Z axis of the quartz seed has a strength of about 0.5 kV/cm to about 6 kV/cm, and maintaining the quartz under those conditions at least until the current passing through the quartz has decreased to a substantially constant value as a function of time;
   (b) removing the impurities which had diffused to the cathode surface of the seed; and
   (c) placing the quartz seed in an autoclave and hydrothermally growing the quartz.

2. Method according to claim 1 wherein the electric field is maintained while the seed is cooled to room temperature.

3. Method according to claim 1 wherein the electric field is applied via electrodes which are comprised of a material that does not diffuse substantially into quartz.

4. Method according to claim 3 wherein the material is selected from the group consisting of the platinum series and gold.

5. Method according to claim 4 wherein the material is platinum.

6. Method according to claim 4 wherein the material is gold.

7. Method according to claim 1 where in step b, a minimum of 0.2 millimeter is removed from the cathode surface of the seed.

8. Method according to claim 1 wherein between steps b and c, the seed is etched in a fluoride type etchant until all evidence of surface damage is removed.

9. Method according to claim 8 wherein the fluoride type etchant is an aqueous solution of ammonium bifluoride.

10. Method according to claim 8 wherein the fluoride type etchant is an aqueous solution of hydrogen fluoride.

11. Method according to claim 8 wherein the fluoride type etchant is an aqueous solution of ammonium fluoride and hydrogen fluoride.

12. Method according to claim 8 wherein the fluoride type etchant is a chemical polish for the major faces of the seed.

13. Method according to claim 1 where the hydrothermal growth is conducted using quartz nutrient which is swept and then deep etched in a fluoride type etchant prior to being placed in the autoclave.

14. Method according to claim 1 where the hydrothermal growth is conducted using quartz nutrient which is deep etched in a fluoride type etchant prior to being placed in the autoclave.

15. Method according to claim 1 wherein step a is conducted in an atmosphere which is substantially free of hydrogen.

16. Method according to claim 1 wherein step a is conducted in a vacuum.

17. Method according to claim 1 wherein step a is conducted in an inert gas atmosphere.

18. Method according to claim 1 wherein steps a and b are repeated prior to step c.

19. Method of growing quartz from a quartz seed and quartz nutrient consisting of
   (a) placing platinum electrodes in contact with the quartz seed,
   (b) heating the quartz seed to about 500 degrees C. while applying an electric field along the Z axis of the quartz seed of a strength of about 2 kV/cm for about 72 hours,
   (c) maintaining the electric field while the seed is cooled to room temperature,
   (d) removing the electrodes from the quartz seed by lapping with an aluminum oxide abrasive until a minimum of 0.2 millimeter is removed from the cathode surface of the seed,
   (e) etching the seed in an aqueous solution of ammonium fluoride and hydrogen fluoride until all evidence of damage produced by the lapping is removed,
   (f) deep etching the quartz nutrient in an aqueous solution of ammonium fluoride and hydrogen fluoride; and
   (g) placing the swept quartz seed and deeply etched quartz nutrient into an autoclave and hydrothermally growing the quartz.

20. Method of growing quartz from a quartz seed consisting of
   (a) placing gold electrodes in contact with the quartz seed,
   (b) heating the quartz seed to about 500 degrees C. while applying an electric field along the Z axis of the quartz seed of a strength of about 2 kV/cm for about 72 hours, (c) maintaining the electric field while the seed is cooled to room temperature, (d) removing the electrodes from the quartz seed by lapping with an aluminum oxide abrasive until a minimum of 0.2 millimeter is removed from the cathode surface of the seed, (e) etching the seed in an aqueous solution of ammonium bifluoride until all evidence of damage produced by lapping is removed, and (f) placing the quartz seed in a noble metal lined autoclave and hydrothermally growing the quartz.

* * * * *